United States Patent
Thomas et al.

(10) Patent No.: US 7,551,765 B2
(45) Date of Patent: Jun. 23, 2009

(54) ELECTRONIC COMPONENT DETECTION SYSTEM

(75) Inventors: Steven P. Thomas, Westfield, IN (US); Timothy D. Garner, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 748 days.

(21) Appl. No.: 10/867,298

(22) Filed: Jun. 14, 2004

(65) Prior Publication Data

US 2005/0286754 A1 Dec. 29, 2005

(51) Int. Cl.
*G06K 9/00* (2006.01)
(52) U.S. Cl. ...................... 382/141; 382/149
(58) Field of Classification Search ................. 382/144, 382/145, 146, 147, 148, 149, 150, 151
See application file for complete search history.

(56) References Cited

U.S. PATENT DOCUMENTS 6,137,893 A * 10/2000 Michael et al. ............. 382/103
6,701,003 B1 * 3/2004 Feinstein .................... 382/147
6,748,104 B1 * 6/2004 Bachelder et al. .......... 382/151
2002/0186878 A1 * 12/2002 Hoon et al. ................. 382/149

* cited by examiner

*Primary Examiner*—Jingge Wu
*Assistant Examiner*—Amara Abdi
(74) *Attorney, Agent, or Firm*—Jimmy L. Funke

(57) ABSTRACT

The present invention provides a method and a system for determining whether a target component of an electronic assembly is assembled correctly. The method of the present invention involves correlating the view of a test electronic assembly with both a positive control image and a negative control image. The positive control image is an image of an electronic assembly that has been assembled properly, whereas the negative control image is an image of an electronic assembly that has been assembled improperly. If the correlation between the test image and the positive control image is greater than the correlation between the test image and the negative control image, the test assembly is assembled properly. On the other hand, if the correlation between the test image and the negative control image is greater than the correlation between the test image and the positive control image, the test assembly is assembled improperly.

24 Claims, 2 Drawing Sheets

ELECTRONIC COMPONENT DETECTION SYSTEM

TECHNICAL BACKGROUND

1. Field of the Invention

The present invention relates to electronic assemblies, more particularly a method and a system for determining whether an electronic assembly is assembled correctly.

2. Description of the Related Art

Because some components of an electronic assembly have polarity, they are required to be assembled in a specific orientation onto a circuit board or a substrate. However, there have been instances in which the components are assembled backwards from the desired orientation. Sometimes the detection of the orientation cannot be readily tested by conventional in-circuit or function product tests, and other tests may be destructive.

A typical non-destructive test relies on visual examination, using a commercially available vision system. Certain commercial vision systems are available whereby a model image having a correct orientation is used to correlate to the actual component being checked. Typically vision correlation algorithms are used to match the pattern of the test electronic assembly with the pattern of the model image. A correlation value of between 0 to 1 may be obtained depending on how close the match is. The value of 0 means the machine cannot find anything that looks like the model image at all. The value of 1 means the machine has found a perfect match. A typical threshold for acceptance of the test electronic assembly might be a value around 0.7.

There are several problems in the process of inspecting electronic components with an automatic vision system. For example, capacitors have a band that marks polarity, but there is also small printing near the band. These markings are not specifically designed for automated vision purposes. The plastic wrap around the part is cut and shrunk around the component. However, the length of the component and the pitch of the printing do not match. Therefore, the wraps that are left around the top of the part may cause the image to vary.

In another example, diodes have a band on one end, and may have printing in the middle with information such as part number of supplier logo. Diodes are often black or grey and their brightness and reflectance can vary. In addition, both caps and diodes may flop or tilt in the holes relative to the circuit board, so the image of the component and board may change from product-to-product.

In checking these components against a fixed image model, a problem occurs due to part variation. The threshold value needs to be set low enough to accommodate the variation, otherwise false rejects will be a problem. If the threshold is set too low, then the possibility of false accepts arises. Vision systems traditionally suffer from being "brittle" whereby small changes in the target image can easily throw off the vision algorithms.

SUMMARY OF THE INVENTION

The present invention provides a method and a system for determining whether polarized components, such as an electrolytic capacitor or diodes, are assembled in the correct orientation on a printed circuit board (PCB) or other substrates.

The method of the present invention involves correlating the view of a test electronic assembly with both a positive control image and a negative control image. The positive control image is an image of an electronic assembly having an observed polarized component arranged in a correct orientation, whereas the negative control image is an image of an electronic assembly having the polarized component arranged in the opposite orientation. The degree of likeness between the test image and the positive control image is compared to the degree of likeness between the test image and the negative control image. If the test image is more like the positive control image, then it is more likely that the polarized component of the test electronic assembly is in a correct orientation. However, if the test image is more like the negative control image, then it is more likely that the polarized component of the test electronic assembly is in an incorrect orientation.

The system of the present invention includes a program software enabling a determination, in mathematical values, of the correlation or the degree of likeness between the image of the test electronic assembly and each of the positive and negative controls. The mathematical values include positive likeness value (PLV), representing the correlation between the image of the test electronic assembly and that of the positive control, and negative likeness value (NLV), representing the correlation between the image of the test electronic assembly and that of the negative control. PLV and NLV may be any value between 0 to 1, where 0 represents no correlation and 1 represents complete likeness. The program software of the present invention further enables a comparison between PLV and NLV. If PLV is greater than NLV, that means that the test electronic assembly is more like the positive control than the negative control. Therefore, it is indicated that the test electronic assembly is assembled properly. On the other hand, if PLV is smaller than NLV, that means that the test electronic assembly is more like the negative control than the positive control. Therefore, it is indicated that the test electronic assembly is assembled improperly.

BRIEF DESCRIPTION OF THE DRAWINGS

The above-mentioned and other features and advantages of this invention, and the manner of attaining them, will become more apparent and the invention itself will be better understood by reference to the following description of embodiments of the invention taken in conjunction with the accompanying drawings, wherein.

Figure 1:
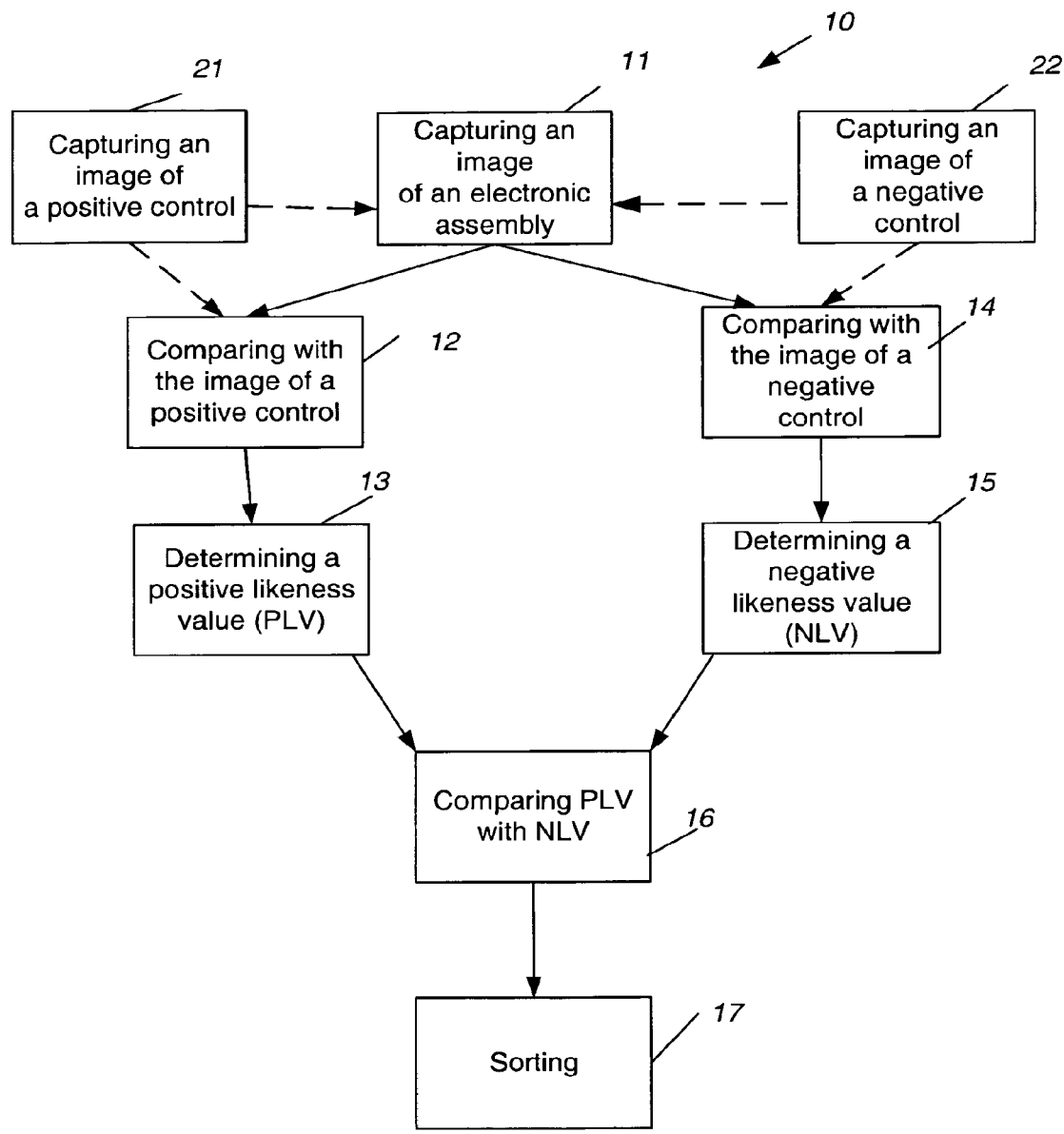
FIG. 1 is a flow diagram of a method of the present invention.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates an embodiment of the invention, in one form, and such exemplifications are not to be construed as limiting the scope of the invention in any manner.

DETAILED DESCRIPTION OF THE INVENTION

The present invention provides a method and a system for screening electronic assemblies during or after a manufacturing process to separate the electronic assemblies that are assembled properly from those that are assembled improperly. The electronic assembly may include any surface-mount electronic assembly having at least one discrete electrical component disposed on a substrate, e.g. a printed circuit board (PCB). The discrete component may include any polarized component such as a capacitor or a diode, which requires a specific orientation for proper functioning.

The method of the present invention involves comparing the image of a newly assembled electronic assembly (test image) with the images of a positive control and a negative control. The positive control is an electronic assembly that has a target component (component to be checked) assembled correctly. For example, the (target) polarized component of the positive control is positioned in a proper orientation. The negative control, on the other hand, has its target component improperly assembled. For example, a polarized component may be mounted in an opposite (backward) orientation of the positive control.

The degree of likeness between the test image and the positive or negative control image may be determined based on a grey-scale correlation (lightness or darkness of the images), or geometric correlation (shapes of the images), or other types of correlation such as a polar correlation (correlation along a "ring" model). If there is any variation due to the background effect, then the background value of each image will be the same. The correlation value will represent the real difference between the images. It is expected that the test image will always look more like the image of one control than the other. In an example of an electronic assembly having a polarized component, if the test image is more like the positive control image, the polarized component of the electronic assembly should be in the correct orientation. However, if the test image is more like the negative control image, that means that the polarized component of the electronic assembly is in the incorrect orientation.

As illustrated in more detail in FIG. 1, method 10 of the present invention includes the steps of capturing an image of a test electronic assembly 11, comparing the image with a positive control image 12 and determining a positive likeness value 13, comparing the image with a negative control image 14 and determining a negative likeness value 15, and comparing the positive and the negative likeness values 16 to identify whether the test electronic assembly is more like the positive control image or the negative control image, and consequently whether the electronic assembly is properly assembled.

As further illustrated in FIG. 1, method 10 of the present invention may include the step of sorting the test electronic assembly 17, based on whether the electronic assembly is properly assembled. The sorting step 17 may include the step of retaining the properly assembled electronic assembly 18, or the step of discarding the improperly assembled electronic assembly 19, or the step of reassembling the improperly assembled electronic assembly 20.

Furthermore, as shown in FIG. 1, method 10 of the present invention may include the steps of capturing a positive control image 21 and capturing a negative control image 22. These steps may be performed prior to or simultaneously with or subsequent to the step of capturing the image of the test electronic assembly 11.

Figure 2:
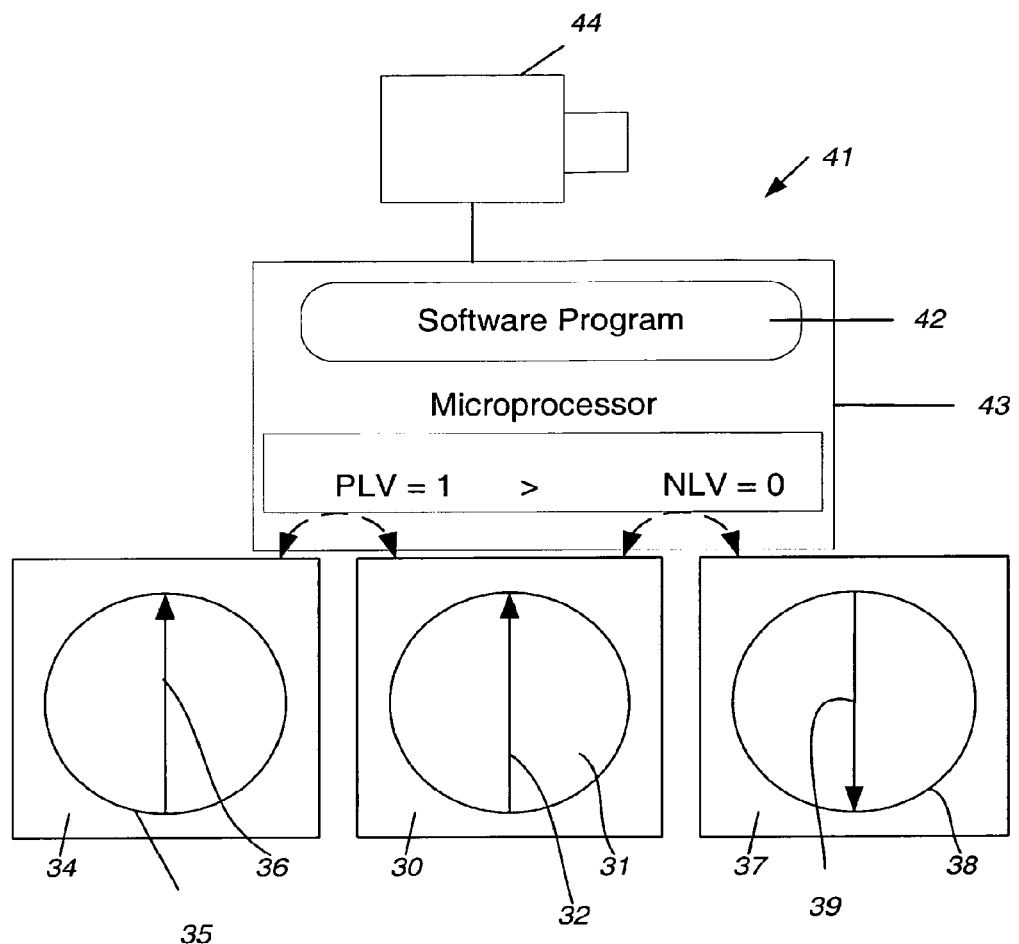
FIG. 2 is a schematic diagram showing comparisons of a test image to the images of positive and negative controls, according to the method of the present invention.

As demonstrated in FIG. 2, system 41 of the present invention comprises program software 42 containing an algorithm for determining grey-scale correlation values or the degrees of likeness between test image 30 and image of the positive control 34 and image of the negative control 37. It is also possible to provide program software 42 that enables the determination of geometric correlation where the shape of the images are compared. System 41 may include processor 43 and other components necessary for the function of a visual system, such as camera 44. When test image 30 is compared to image of the positive control 34, a correlation value called a positive likeness value (PLV) is created. Similarly, when test image 30 is compared to image of the negative control 37, a correlation value called a negative likeness value (NLV) is created. PLV and NLV may be created based on any appropriate numerical scale. For example, the scale of 0 to 1, where 0 indicates no likeness (no match between the test image and the image of a control) and 1 indicates complete likeness (complete match between the test image and the image of the control), may be suitable. It is contemplated that other scales such as 0 to 100 or 0 to 1000 may also be used to determine PLV and NLV. The program software of the present invention further enables a comparison between PLV and NLV. Since PLV is greater than NLV, it is confirmed that the test electronic assembly has the capacitor correctly oriented on the board or substrate.

Although the illustration in FIG. 2 relates to only the orientation of a polarized component, it is to be understood that the method of the present invention may also be used to detect any other component defects, such as a mis-placement of a component or a missing component.

As mentioned above, the program software may be operably integrated in a processor of a vision machine. The processor may further facilitate other functions of the vision machine such as imaging function. The processor may include a memory for storing images of the positive control and the negative control to be used in the image comparisons. The processor may further include software for enabling separating the test electronic assemblies into groups, one having assemblies that are properly assembled and the other having assemblies that are improperly assembled. The vision machine, as known in the industry, may include a robotic system that allows automatic functions such as picking up samples and sorting the test electronic assemblies.

EXAMPLE

Two product lines of PCB assemblies were tested using EPSON robot system implemented with the program software of the present invention. The result from the test of the orientation of two diodes on over 200,000 boards of one product line yielded only a few false fails (correct orientation identified as incorrect orientation) but no false accepts (incorrect orientation identified as correct orientation). The result from the test of another product line of 30,000 boards, each having an electrolytic capacitor, showed no false fails or false accepts.

One advantage of the method and system of the present invention is that is it easy to implement with readily available vision tools, eliminating the need for extensive vision algorithm development. A simple grey-scale correlation, geometric correlation, or polar correlation algorithm can be set up for use in a matter of minutes.

Another advantage is that the present system can detect the small movement of the components that occur when the parts are sitting in circuit board holes before the wave solder process. This variation is normal and would be a problem if a system had to look at a fixed board location.

While the present invention has been described as having exemplary embodiments, the present invention can be further modified within the spirit and scope of this disclosure. This application is therefore intended to cover any variations, uses, or adaptations of the invention using its general principles.

Further, this application is intended to cover such departures from the present disclosure as come within known or customary practice in the art to which this invention pertains.

What is claimed is:

1. A method for screening electronic assemblies, comprising a processor performing the steps comprising:
   (a) capturing a test image of an electronic assembly;
   (b) determining a positive likeness value (PLV) based on a first degree of likeness between the test image and an image of a positive control, wherein the PLV is based upon a model of a correctly assembled electronic assembly;
   (c) determining a negative likeness value (NLV) based on a second degree of likeness between the test image and an image of a negative control, wherein the NLV is based upon a model of an incorrectly assembled electronic assembly; and
   (d) comparing the PLV with the NLV to determine if the imaged portion of the electronic assembly is assembled properly.

2. The method of claim 1 further comprising the step of retaining the electronic assembly, when step (d) results in the PLV being greater than the NLV.

3. The method of claim 1 further comprising the step of discarding the electronic assembly, when step (d) results in the PLV being smaller than the NLV.

4. The method of claim 1 further comprising the step of reassembling the electronic assembly, when step (d) results in the PLV being smaller than the NLV.

5. The method of claim 1, wherein the PLV in step (b) and the NLV in step (c) are determined based on grey-scale correlations of the corresponding images.

6. The method of claim 1, wherein the PLV of step (b) and the NLV of step (c) are based on geometric correlations of the corresponding images.

7. The method of claim 1, wherein the PLV of step (b) and the NLV of step (c) are based on polar correlations of the corresponding images.

8. The method of claim 1, wherein each of the PLV and the NLV is a number between 0 and 1, wherein 0 indicates no likeness, and 1 indicates complete likeness.

9. The method of claim 1 further comprising the steps of:
   (e) capturing the image of a positive control from a first electronic assembly having a target component disposed in a correct orientation; and
   (f) capturing the image of a negative control from a second electronic assembly having the target component disposed in an incorrect orientation.

10. A vision detection system for detecting a defect in electronic assemblies comprising:
    means for obtaining images of electronic assemblies; and
    program software operably connected to the means for obtaining the images, the program software containing an algorithm for determining degrees of likeness between an image of a test electronic assembly and images of a positive control and a negative control, wherein the positive control is a model of a correctly assembled electronic assembly, and the negative control is a model of an incorrectly assembled electronic assembly, and the program software including instructions for comparing the degrees of likeness to determine whether the image of the test electronic assembly is more like the image of the positive control or the image of the negative control.

11. The system of claim 10, further comprising a processor operably communicated with the program software wherein the program software adapted to enable the processor to create a positive likeness value (PLV) representing a first degree of likeness between the image of the electronic assembly and the image of the positive control, and a negative likeness value (NLV) representing a second degree of likeness between the image of the electronic assembly and the image of the negative control, and compare the PLV to the NLV.

12. The system of claim 11, wherein the PLV and the NLV are calculated based on grey-scale correlations between the corresponding images.

13. The system of claim 11, wherein the PLV and the NLV are calculated based on geometric correlations between the corresponding images.

14. The system of claim 11, wherein the PLV and the NLV are calculated based on polar correlations between the corresponding images.

15. The system of claim 11, wherein the software calculated each of the PLV and the NLV to be a number between 0 to 1, and wherein 0 indicates no likeness, and 1 indicates complete likeness.

16. In an image processing system, a computer readable medium encoded with software comprising:
    instructions for comparing images of electronic assembly and a positive and a negative control images, wherein the positive control image is an image of a correctly assembled model, and the negative control image is an image of an incorrectly assembled model; and
    instructions for determining degrees of likeness of the images of the electronic assembly to the positive and the negative control images to determine if the imaged portion of the electronic assembly is assembled correctly.

17. The computer readable medium encoded with software of claim 16, wherein the program software is adapted to enable a processor to create a positive likeness value (PLV) representing the degree of likeness between the image of the electronic assembly and the image of the positive control, and a negative likeness value (NLV) representing the degree of likeness between the image of the electronic assembly and the image of the negative control, and compare the PLV to the NLV.

18. The computer readable medium encoded with software of claim 17, wherein each of the PLV and the NLV is calculated to be a number between 0 to 1, and wherein 0 indicates no likeness, and 1 indicates complete likeness.

19. The computer readable medium encoded with software of claim 17, wherein the PLV and the NLV are calculated based on grey-scale correlations between corresponding images.

20. The computer readable medium encoded with software of claim 17, wherein the PLV and the NLV are calculated based on geometric correlations between corresponding images.

21. The computer readable medium encoded with software of claim 17, wherein the PLV and the NLV are calculated based on polar correlations between corresponding images.

22. The method of claim 1 further comprising at least one of the following steps:
    retaining the electronic assembly when step (d) results in the PLV being greater than the NLV;
    discarding the electronic assembly when step (d) results in the PLV being smaller than the NLV; and
    reassembling the electronic assembly when step (d) results in the PLV being smaller than the NLV.

23. The vision detection system of claim 10, wherein the program software algorithm further includes the instructions for at least one of:

retaining the electronic assembly when the degree of likeness of the positive control is greater than the degree of likeness of the negative control;

discarding the electronic assembly when the degree of likeness of the positive control is smaller than the degree of likeness of the negative control; and reassembling the electronic assembly when the degree of likeness of the positive control is smaller than the degree of likeness of the negative control.

24. The image processing system of claim 16 further comprising at least one of:

instructions for retaining the electronic assembly when the degree of likeness of the positive control is greater than the degree of likeness of the negative control;

instructions for discarding the electronic assembly when the degree of likeness of the positive control is smaller than the degree of likeness of the negative control; and instructions for reassembling the electronic assembly when the degree of likeness of the positive control is smaller than the degree of likeness of the negative control.

* * * * *